United States Patent
Guillaud

(10) Patent No.: US 10,674,611 B2
(45) Date of Patent: Jun. 2, 2020

(54) METHOD OF REDUCING THE THICKNESS OF AN ELECTRONIC CIRCUIT

(71) Applicant: NagraID Security, Culver City, CA (US)

(72) Inventor: Philippe Guillaud, Culver City, CA (US)

(73) Assignee: NAGRAID SECURITY, Culver City, CA (US)

( * ) Notice: Subject to any disclaimer, the term of this patent is extended or adjusted under 35 U.S.C. 154(b) by 270 days.

(21) Appl. No.: 14/753,509

(22) Filed: Jun. 29, 2015

(65) Prior Publication Data

US 2016/0381808 A1    Dec. 29, 2016

(51) Int. Cl.
*H05K 3/30* (2006.01)
*H05K 3/28* (2006.01)
*H05K 1/02* (2006.01)
*G06K 19/077* (2006.01)
*H05K 3/14* (2006.01)

(52) U.S. Cl.
CPC .......... *H05K 3/284* (2013.01); *G06K 19/077* (2013.01); *G06K 19/07745* (2013.01); *H05K 1/0224* (2013.01); *H05K 1/0259* (2013.01); *H05K 3/14* (2013.01); *H05K 3/30* (2013.01); *G06K 19/07749* (2013.01); *H05K 2201/0715* (2013.01); *H05K 2203/06* (2013.01)

(58) Field of Classification Search
CPC .... H05K 1/0224; H05K 1/0259; H05K 1/186; H05K 1/188; H05K 3/14; H05K 3/202; H05K 3/284; H05K 3/303; H05K 3/3457; H05K 3/363; H05K 3/4602; H01L 24/24; H01L 24/82
See application file for complete search history.

(56) References Cited

U.S. PATENT DOCUMENTS

| | | | |
|---|---|---|---|
| 6,894,515 B2 * | 5/2005 | Okano | G01R 1/06794 324/750.25 |
| 7,488,901 B2 * | 2/2009 | Arnold | H05K 9/0024 174/377 |
| 7,633,015 B2 * | 12/2009 | Wurzel | H01L 23/552 174/260 |
| 7,715,203 B2 * | 5/2010 | Choi | H04B 1/38 361/760 |
| 8,258,012 B2 * | 9/2012 | Pagaila | H01L 23/5389 257/E21.001 |
| 8,606,195 B2 * | 12/2013 | Suetake | H01Q 1/243 455/121 |
| 9,357,660 B2 * | 5/2016 | Yoshikawa | H01L 23/49827 |
| 2008/0135282 A1 * | 6/2008 | Jonnalagadda | H05K 1/16 174/260 |

(Continued)

*Primary Examiner* — Paul D Kim
(74) *Attorney, Agent, or Firm* — MH2 Technology Law Group, LLP

(57) ABSTRACT

Disclosed is a method of reducing the thickness of an electronic circuit comprising a printed circuit and electronic components. The method includes the following operations: mounting electronic components in die form on the printed circuit, putting an insulating layer into place on the electronic components, and putting a conductive layer on the insulating layer. Various embodiments include an electronic circuit obtained by such a method; a thin plastic card, such as in a credit card format, including such an electronic circuit; and a bank card including such an electronic circuit.

18 Claims, 2 Drawing Sheets

(56) References Cited

U.S. PATENT DOCUMENTS

2013/0242519 A1\* 9/2013 Gao .................... H05K 1/0225
    361/781
2014/0182911 A1\* 7/2014 Lee ....................... H05K 1/185
    174/260

\* cited by examiner

METHOD OF REDUCING THE THICKNESS OF AN ELECTRONIC CIRCUIT

The present invention relates to a method of reducing the thickness of an electronic circuit. An electronic circuit typically comprises a printed circuit serving as a support and providing electrical connections, and serving to receive electronic components that are assembled on said support.

The object of the present invention is to make an electronic circuit that is suitable for being incorporated in a thin support, of thickness that is typically less than 1 millimeter (mm), such as a plastics card in compliance with the ISO 7810 standard, which stipulates a thickness of 0.76 mm±0.08 mm.

In order to make an electronic circuit of small thickness, it is known to make a circuit that is substantially plane in a single layer by selecting, both for the printed circuit and for the electronic circuit, elements that are small in thickness. The thickness of a printed circuit can be reduced to a thickness that is very small. Nevertheless, ordinary electronic components, even when specified as being thin, include protective packages of thickness that is rarely less than 1 mm. Such packages protect electronic components, mainly against the effects of electric static discharges.

The invention provides a method of reducing the thickness of an electronic circuit comprising a printed circuit and electronic components, comprising the following steps: mounting electronic components in die form on the printed circuit, putting an insulating layer into place on the electronic components, and putting a conductive layer on the insulating layer.

According to another characteristic, the conductive layer is connected to ground, preferably at a plurality of points.

According to another characteristic, the ground connection is made by an independent connection element.

According to another characteristic both the insulating layer and the conductive layer are put into place by depositing respective liquid and/or solid materials. By way of example, such a material may be an ink, a varnish, . . . .

According to another characteristic, both the insulating layer and the conductive layer comprise respective adhesives and both the insulating layer and the conductive layer are made by applying pressure, preferably by means of a flexible pad, more preferably while hot.

According to another characteristic, the adhesive serving to hold the conductive layer is conductive, at least in register with one or more ground portions.

According to another characteristic, both the insulating layer and the conductive layer comprise respective films of thickness less than or equal to 0.1 mm.

According to another characteristic, the conductive layer comprises a metallic material, preferably copper.

According to another characteristic, the insulating layer has a gap over at least one orifice, over at least one ground portion, and/or over at least one thick component.

According to another characteristic, the conductive layer leaves a gap over at least one orifice, over at least one communication component, and/or over at least one thick component.

According to another characteristic, said thick component comprises a crystal.

According to another characteristic, the communication component comprises an antenna.

The invention also provides an electronic circuit obtained by such a method.

The invention also provides a thin plastics card in credit card format including such an electronic circuit.

The invention also provides a bank card including such an electronic circuit.

Other characteristics, details, and advantages of the invention appear more clearly from the detailed description given below by way of indication and with reference to the drawings, in which.

Figure 1:
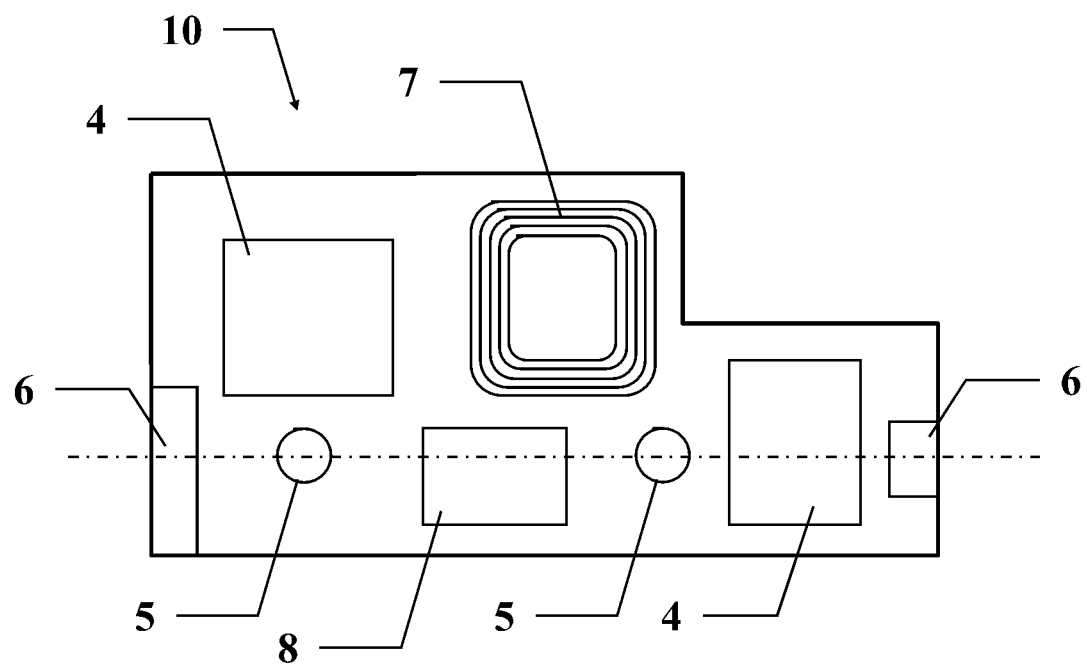
FIG. 1 shows an example of an electronic circuit in face view.
Figure 2:
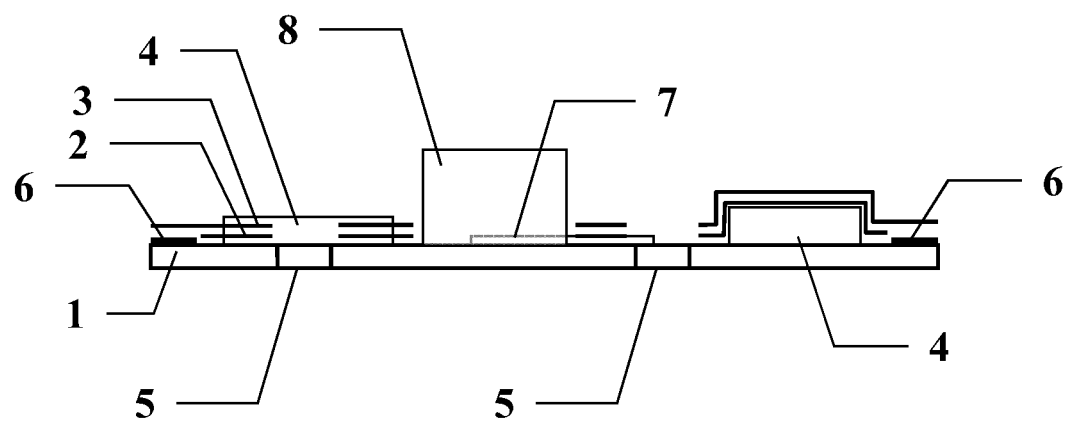
FIG. 2 shows a view of the FIG. 1 electronic circuit in section on an axis marked in FIG. 1.

The invention seeks to reduce the thickness of an electronic circuit 10. An electronic circuit 10 typically comprises a printed circuit 1 serving as a support and serving to provide electrical connections, together with electronic components 4, 7, 8 that are mounted on said support 1, typically by soldering.

Given the target final thickness for the assembly, everything is done to reduce thickness.

Conventional measures for reducing thickness are assumed already to have been performed: the printed circuit 1 and the electronic components 4, 7, 8 are selected from among the thinnest available versions, the printed circuit 1 is a plane single layer circuit without a mezzanine.

If it is made in conventional manner, with electronic components 4, 8 having respective packages, the electronic circuit 10 presents thickness of more than 1 mm. It is desired to further reduce its thickness. This reduction in thickness may be achieved by means of a thickness reduction method. Such a method comprises the following steps.

It is mentioned above that the protective packages of electronic components 4, 8 present a residual thickness of about 1 mm. Thus a first step consists in eliminating the packages from electronic components 4, 8 that have such packages. In practice, this step is made by obtaining bare electronic components 4, 8 without packages, known as "dies", and mounting them on the printed circuit 1 in conventional manner. This step serves to achieve a substantial saving in thickness. An electronic component in die form presents residual thickness of less than 350 micrometers ($\mu$m) and preferably less than 250 $\mu$m.

Nevertheless, those packages serve to protect the electronic components 4, 8 that they contain, mainly against electric static discharge (ESD) and the harmful effects of such discharge on electronic components 4, 8 and on their operation. Thus, an ESD can act on a memory so as to change its state, thereby modifying or deleting its content. Likewise, an ESD can cause an electronic component to be reinitialized. This can lead to harmful losses of data.

ESD protection is thus provided by means of installing an insulating layer 2 on the electronic circuit 10 on the same side as the electronic components 4, 7, 8, i.e. electronic components in die form, that do not have their packages, and by putting into place a conductive layer 3 on the insulating layer 2. These two layers serve to recreate ESD protection as a replacement for the protection lost by removing the packages. With an appropriate choice for the two layers, the insulating layer 2 and the conductive layer 3, in particular in terms of thickness, a considerable saving in thickness can be achieved compared with the packages conventionally used.

In order to form an ESD screen, the conductive layer 3 is advantageously connected to ground, 0V. In the event of an electrostatic discharge, this makes it possible to divert the surge. In order to perform this diversion function as well as possible, i.e. as close as possible to the discharge, the connection to ground 6 is preferably made at a plurality of points. Thus, the probability of having a connection point close to the place where the discharge occurs is increased.

In an embodiment, the connection to ground 6 is made by an independent connection element. This connection element may be an adhesive strip that is conductive at least on its adhesive portion. The conductive strip is advantageously flexible.

In order to avoid the conductive layer 3 coming into contact with a potential other than the 0V of ground 6, in particular when it is associated with electronic components 4, 8 without their packages, an electrically insulating layer 2 is advantageously arranged in intermediate position between the electronic components 4, 7, 8 and the conductive layer 3.

In order to ensure that the insulating layer 2 is put into place and held over the electronic components on their sides remote from the printed circuit, the insulating layer 2 is advantageously provided with adhesive on its face that is to come into contact with the electronic components 4, 7, 8. Likewise, in order to ensure that the conductive layer 3 is put into place and held on the insulating layer 2, the conductive layer 3 is advantageously provided with adhesive on its face that it to come into contact with the insulating layer 2.

In an additional or complementary embodiment, the insulating layer 2 is also advantageously provided with adhesive on its other face: on its face that is to come into contact with the conductive layer 3.

Nevertheless, the embodiment in which the adhesive is arranged on the conductive layer 3 is preferable since it enables the conductive layer 3 to adhere, including on the ground portion(s) 6, where there is no insulating layer 2.

For the same reason, the adhesive serving to hold the conductive layer 3 is advantageously conductive, at least in register with the ground portion(s) 6.

The insulating and conductive layers 2 and 3 are arranged in this way. The assembly comprising the electronic circuit 10, the insulating layer 2, and the conductive layer 3 is advantageously assembled by lamination. Lamination is performed in known manner by means of a pad applying pressure in the thickness direction. On its side where the electronic components are arranged and on which the two layers 2 and 3 are deposited, the electronic circuit 10 presents a surface that is uneven. Thus, the pad is advantageously a flexible pad so that the layer or both layers 2, 3 pressed together against the electronic circuit 10 come to fit closely to the shapes of said uneven surface of the electronic components.

The two layers are thus put into a shape that is parallel to the electronic components 4, 7, and they are also adhesively bonded to the outside surfaces of said electronic components 4, 7. This makes it possible advantageously to increase the stiffness of the assembly formed by the electronic circuit 10 and the two layers 2, 3 covering it.

Lamination is advantageously performed hot, at a temperature lying in the range 40° C. to 70° C., and preferably of the order of 65° C.

Lamination is an advantageous technique since the pressing of the layer or both layers 2, 3 by the pad serves to expel air and thus avoid any harmful presence of bubbles.

In an alternative implementation, the insulating layer 2 and/or the conductive layer 3 may be made by depositing liquid and/or solid material(s). In this implementation, the layer is obtained by means of a liquid material of the paint, ink, or varnish type that is deposited by spraying or by means of a brush. Advantageously, the liquid material as deposited in this way subsequently hardens to form the layer 2, 3.

Since the objective is to reduce the total thickness of the electronic circuit 10 fitted with its two layers 2 and 3, the thickness of each of the two layers 2 and 3 is advantageously as small as possible. Thus, the insulating layer 2 advantageously comprises a film of thickness less than or equal to 0.1 mm. Likewise, the conductive layer 3 comprises a film of thickness less than or equal to 0.1 mm.

In an embodiment, in order to be conductive, the conductive layer 3 comprises a metallic material, preferably copper.

Both the insulating layer 2 and the conductive layer 3 present an outline that is limited to the outline of the printed circuit 1.

Furthermore, certain zones of the electronic circuit 10 may be associated with gaps where there is no layer 2, 3.

The electronic circuit 10 may have orifices or cutouts 5, as shown in FIGS. 1-4. In register with these orifices 5, neither the insulating layer 2, nor the conductive layer 3 is useful. The insulating layer 2 and the conductive layer 3 thus advantageously include gaps in register with each of the orifices 5.

In order to provide the desired contact between ground and the conductive layer 3, the insulating layer 2 advantageously does not cover ground portions 6 present on the electronic circuit 10. Thus, the insulating layer 2 advantageously has a gap in register with each of the ground portions 6 of the electronic circuit 10. These gaps enable the conductive layer 3 to come into electrical contact with ground 6, and possibly also to adhere thereto.

It can happen that a thicker component 8, is so thick that the target thickness cannot be achieved if that thickness is added to the thickness of at least one of the layers 2 and 3, on being covered with the insulating layer 2 and/or the conductive layer 3. Even though they are small, the thicknesses of the layers 2 and 3 are additional to the thickness of said thick component 8.

The component is said to be thick when it has a target thickness that is not to be exceeded. Thus, by way of example, for a thickness that is to remain less than 0.76 mm, a component is considered as being thick if its thickness is greater than or equal to 350 µm. Advantageously, the thickness of a thick component is less than or equal to 450 µm.

Thus, in this particular circumstance, a gap is advantageously formed in one of the insulating layer 2 and the conductive layer 3, or in both of them 2 and 3, in register with said thick component 8.

By way of example of a thick component, mention may be made of a crystal 8.

For functional reasons, an electronic component, such as a communication component 7, may be inoperative in association with an ESD screen. Under such circumstances, a gap is advantageously provided in register with the communication electronic component 7, at least in the conductive layer 3.

As examples of communication components, mention may be made of an antenna 7 or of any other component making use of radiation (radio, light, etc. . . . ) that could be interrupted by a conductive layer 3 or more generally by a layer that is opaque to said radiation.

Figure 3:
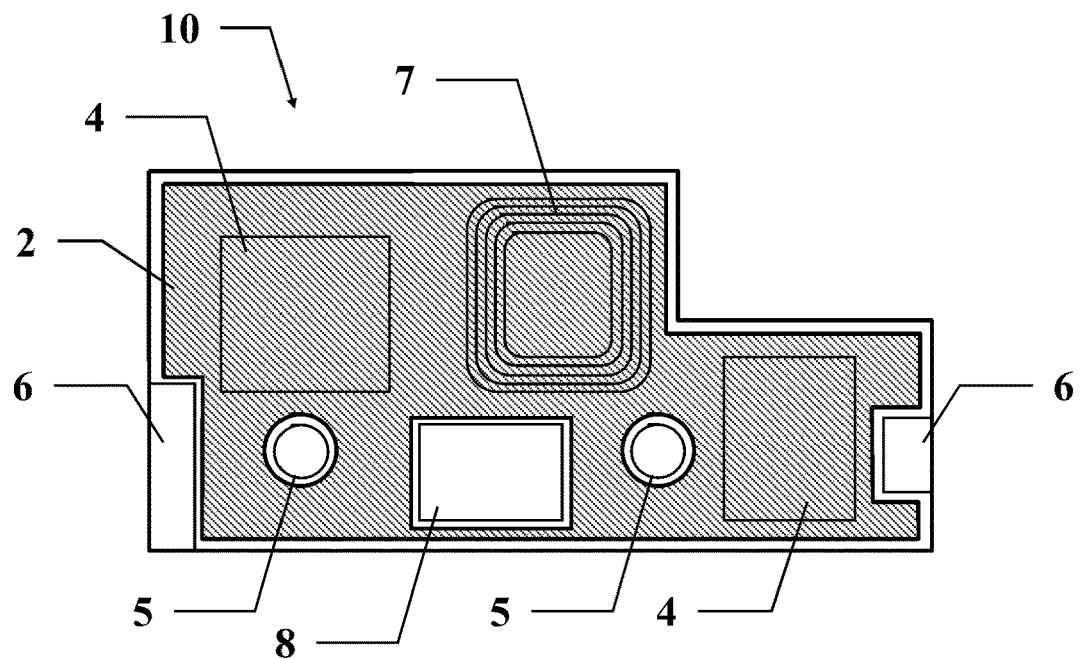
FIG. 3 shows the same electronic circuit including an insulating layer.
Figure 4:
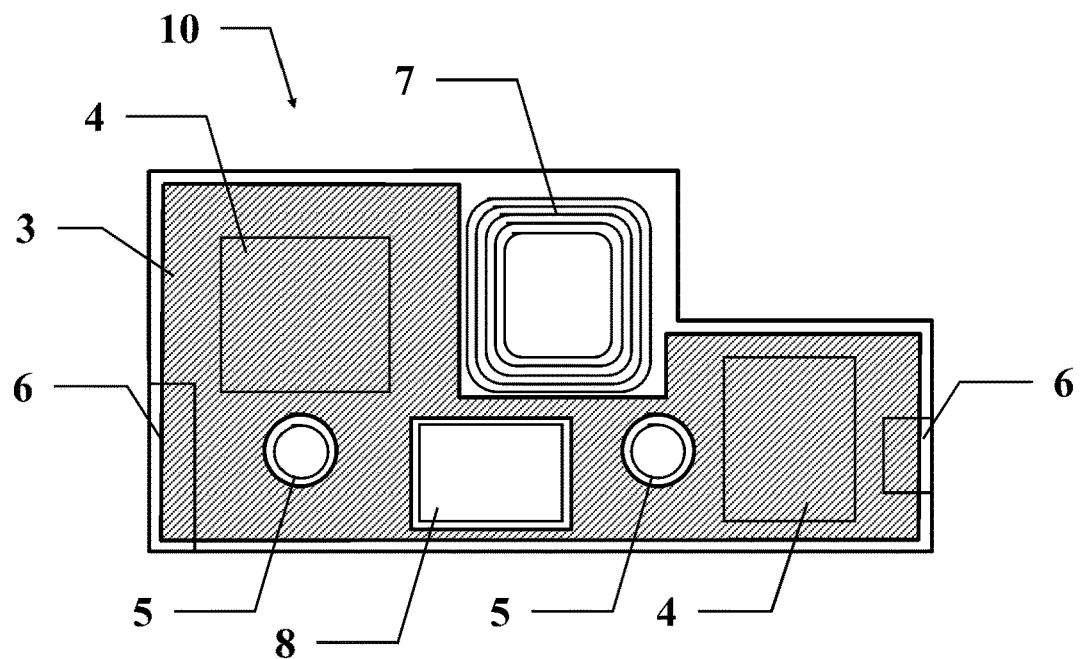
FIG. 4 shows the same electronic circuit including conductive layer.

FIGS. 1, 3, and 4 are face views of the same electronic circuit 10. FIG. 1 presents the electronic circuit 10 on its own. FIG. 3 presents more particularly the outline of an insulating layer 2. Gaps can be seen in register with two holes 5, in register with ground portions 6, and in register with a crystal 8. FIG. 4 presents more particularly the outline of a conductive layer 3. Gaps can be seen in register with the two holes 5, in register with an antenna 7, and in register with the crystal 8.

The invention also provides an electronic circuit 10 that has been subjected to such a method.

The invention also provides a thin plastics card in credit card format including such an electronic circuit 10. In particular, the invention provides a bank card.

The invention is advantageous in that it makes it possible to make an electronic circuit that is thin enough to be incorporated in the thickness of a plastics card in compliance with the ISO 7810 standard, which specifies a thickness of 0.76 mm±0.08 mm for such a bank card.

The invention claimed is:

1. A method of reducing the thickness of an electronic circuit comprising a printed circuit and electronic components, the method comprising:
    mounting one or more unpackaged bare electronic components in die form on the printed circuit;
    putting an insulating layer into place on the one or more unpackaged bare electronic components mounted on the printed circuit; and
    putting a conductive layer on the insulating layer such that said insulating layer is interposed between the one or more unpackaged bare electronic components and the conductive layer, wherein the insulating layer and the conductive layer together provide electric static discharge (ESD) protection for the one or more unpackaged bare electronic components, wherein the insulating layer comprises an opening over at least one ground portion of the printed circuit, to enable the conductive layer to come into electrical contact with said at least one ground portion.

2. The method according to claim 1, wherein the conductive layer is connected to the at least one ground portion to produce a ground connection.

3. The method according to claim 2, wherein the ground connection is made by an independent connection element.

4. The method according to claim 1, wherein both the insulating layer and the conductive layer are put into place by depositing respective liquid or solid materials.

5. The method according to claim 1, wherein the conductive layer comprises adhesive, serving to hold the conductive layer, which is conductive at least in contact with the one or more ground portions.

6. The method according to claim 5, wherein the insulating layer comprises adhesive on a face of the insulating layer that comes into contact with said one or more unpackaged bare electronic components.

7. The method according to claim 5, wherein both the insulating layer and the conductive layer are made by applying pressure with a flexible pad.

8. The method according to claim 5, wherein both the insulating layer and the conductive layer are made by applying pressure while hot.

9. The method according to claim 1, wherein both the insulating layer and the conductive layer comprise respective films of thickness less than or equal to 0.1 mm.

10. The method according to claim 1, wherein the conductive layer comprises a metallic material.

11. The method according to claim 10, wherein the metallic material comprises copper.

12. The method according to claim 1, wherein the insulating layer comprises a second opening over at least one orifice, or over at least one thick component.

13. The method according to claim 12, wherein said at least one thick component comprises a crystal.

14. The method according to claim 1, wherein the conductive layer comprises a gap over at least one orifice, over at least one communication component, or over at least one thick component.

15. The method according to claim 14, wherein the at least one communication component comprises an antenna.

16. The method according to claim 1, wherein the conductive layer is connected to ground at a plurality of points.

17. The method according to claim 1, wherein both the insulating layer and the conductive layer are put into place by depositing both liquid and solid materials.

18. The method of claim 1, wherein the insulating layer and the conductive layer are put into place such that the printed circuit comprising the one or more unpackaged bare electronic components provided with the electric static discharge protection has a thickness less than or substantially equal to 0.76 mm.

* * * * *